US012674945B2

(12) United States Patent
Xiao et al.

(10) Patent No.: US 12,674,945 B2
(45) Date of Patent: Jul. 7, 2026

(54) LIGHT-EMITTING ASSEMBLY AND OPTICAL COMMUNICATION APPARATUS

(71) Applicant: Huawei Technologies Co., Ltd., Shenzhen (CN)

(72) Inventors: Xiaokang Xiao, Dongguan (CN); Yuejing Qin, Dongguan (CN); Ying Guo, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 271 days.

(21) Appl. No.: 18/647,242

(22) Filed: Apr. 26, 2024

(65) Prior Publication Data

US 2024/0272384 A1     Aug. 15, 2024

Related U.S. Application Data

(63) Continuation of application No. PCT/CN2022/127128, filed on Oct. 24, 2022.

(30) Foreign Application Priority Data

Oct. 28, 2021     (CN) .......................... 202111265539.6

(51) Int. Cl.
G02B 6/42          (2006.01)
G02B 6/36          (2006.01)
                   (Continued)

(52) U.S. Cl.
CPC ........... G02B 6/425 (2013.01); G02B 6/3652 (2013.01); G02B 6/4213 (2013.01);
                   (Continued)

(58) Field of Classification Search
CPC .... G02B 6/425; G02B 6/3652; G02B 6/4213; G02B 6/4214; G02B 6/423; G02B 6/43; H01S 5/005; H01S 5/4025
                   (Continued)

(56) References Cited

U.S. PATENT DOCUMENTS 5,128,956 A * 7/1992 Aoki ..................... G02B 6/4208
                                                           372/98
2015/0098127 A1* 4/2015 Kurokawa ............. H04B 10/50
                                                           359/484.03
                   (Continued)

FOREIGN PATENT DOCUMENTS

CN          102937753 A      2/2013
CN          103309059 A      9/2013
                   (Continued)

OTHER PUBLICATIONS

C. R. Doerr et al:"Characterization of the Hybrid Integration of a Shared Dispersive Element Laser and a Modulator", Journal of Lightwave Technology, vol. 16, No. 12, Dec. 1998, total 6 pages.

*Primary Examiner* — Dalzid E Singh
(74) *Attorney, Agent, or Firm* — Slater Matsil, LLP

(57)          ABSTRACT
A light-emitting assembly includes a laser, an optical isolator, and a polarization maintaining device. The laser is configured to emit a first optical signal; the polarization maintaining device is configured to receive a second optical signal; and the optical isolator includes a polarizer and an optical rotator. The laser, the polarizer, the optical rotator, and the polarization maintaining device are sequentially arranged, a polarization direction of the polarizer is the same as a polarization direction of the first optical signal, and the optical rotator is configured to deflect the first optical signal into the second optical signal.

18 Claims, 8 Drawing Sheets

(51) Int. Cl.
  *G02B 6/43* (2006.01)
  *H01S 5/00* (2006.01)
  *H01S 5/40* (2006.01)

(52) U.S. Cl.
  CPC ........... *G02B 6/4214* (2013.01); *G02B 6/423* (2013.01); *G02B 6/43* (2013.01); *H01S 5/005* (2013.01); *H01S 5/4025* (2013.01)

(58) Field of Classification Search
  USPC ........................................................ 398/201
  See application file for complete search history.

(56) References Cited

U.S. PATENT DOCUMENTS

| | | | | |
|---|---|---|---|---|
| 2016/0274305 A1* | 9/2016 | Ye | ......................... | H04B 10/503 |
| 2020/0403372 A1* | 12/2020 | Baker | ................... | H01S 3/1608 |

FOREIGN PATENT DOCUMENTS

| | | | |
|---|---|---|---|
| CN | 203465449 U | 3/2014 |
| CN | 205826997 U | 12/2016 |
| CN | 206272064 U | 6/2017 |
| CN | 207473128 U | 6/2018 |
| CN | 211348709 U | 8/2020 |
| FR | 2714740 A1 | 7/1995 |
| GB | 2245378 A | 1/1992 |
| JP | H01281415 A | 11/1989 |
| JP | 2003315735 A | 11/2003 |
| JP | 2007140567 A | 6/2007 |
| JP | 2016012063 A | 1/2016 |
| WO | 0123949 A1 | 4/2001 |

* cited by examiner

LIGHT-EMITTING ASSEMBLY AND OPTICAL COMMUNICATION APPARATUS

CROSS-REFERENCE TO RELATED APPLICATIONS

This application is a continuation of International Application No. PCT/CN2022/127128, filed on Oct. 24, 2022, which claims priority to Chinese Patent Application No. 202111265539.6, filed on Oct. 28, 2021. The disclosures of the aforementioned applications are hereby incorporated by reference in their entireties.

TECHNICAL FIELD

This application relates to the field of optical communication, and in particular, to a light-emitting assembly and an optical communication apparatus.

BACKGROUND

An optical isolator is one of important components of a light-emitting assembly, and the optical isolator is mainly configured to form a unidirectionally conductive optical path. In this way, it can be ensured that the light-emitting assembly outputs an optical signal having a low loss, and it can also be ensured that the light-emitting assembly resists interference of an optical signal reflected in a channel.

In a conventional technology, the optical isolator mainly includes a polarizer, an optical rotator, and a polarization analyzer, and the three components work together to form a unidirectionally conductive optical path in the light-emitting assembly.

However, the foregoing optical isolator has a complex structure, resulting in high manufacturing costs, and a use effect of the optical isolator is limited by assembly precision.

SUMMARY

Embodiments of this application provide a light-emitting assembly and an optical communication apparatus, to resolve problems of a complex structure and a high requirement on assembly precision.

According to a first aspect, a light-emitting assembly is provided. The light-emitting assembly includes a laser, an optical isolator, and a polarization maintaining device. The laser is configured to emit a first optical signal, and the polarization maintaining device is configured to receive a second optical signal. The optical isolator includes a polarizer and an optical rotator. Both the polarizer and the optical rotator are located between the laser and the polarization maintaining device, and the laser, the polarizer, the optical rotator, and the polarization maintaining device are sequentially arranged. A polarization direction of the polarizer is the same as a polarization direction of the first optical signal, and the optical rotator can deflect the first optical signal into the second optical signal. In other words, the second optical signal received by the polarization maintaining device is formed after the first optical signal passes through the polarizer and the optical rotator sequentially.

The light-emitting assembly provided in this embodiment of this application has at least the following effects:

After the laser emits the first optical signal, the first optical signal is transmitted to the polarizer. Because the polarization direction of the polarizer is the same as the polarization direction of the first optical signal, the first optical signal can pass through the polarizer in a lossless manner. After passing through the polarizer, the first optical signal is transmitted to the optical rotator, the first optical signal is deflected into the second optical signal under an action of the optical rotator, and the second optical signal is transmitted to the polarization maintaining device, to be received by the polarization maintaining device. Therefore, an entire optical signal emission process of the light-emitting assembly is completed.

In the optical signal emission process, a part of an optical signal is reflected by the polarization maintaining device, and a polarization direction of the reflected optical signal is the same as a polarization direction of the second optical signal. The reflected optical signal is transmitted to the optical rotator, and is deflected under the action of the optical rotator. The deflected optical signal is transmitted to the polarizer. Because a polarization direction of the optical signal is different from that of the polarizer, the polarizer absorbs the optical signal, to isolate the optical signal, thereby preventing the optical signal from interfering with the laser.

It can be learned that the light-emitting assembly provided in this embodiment of this application can ensure that an optical signal having a low loss is outputted, and can also ensure that interference of a reflected optical signal is resisted. In addition, because the optical isolator includes only the polarizer and the optical rotator, the optical isolator has a simple structure and a low requirement on assembly precision.

In an implementation of this application, no polarization analyzer exists between the optical rotator and the polarization maintaining device. In other words, compared with an optical isolator having a polarizer, an optical rotator, and a polarization analyzer in a related technology, the optical isolator provided in this embodiment of this application includes only the polarizer and the optical rotator and does not include the polarization analyzer. In this way, a concise structure of the optical isolator is ensured. During assembly, only assembly precision between the polarizer and the optical rotator needs to be considered, so that an assembly requirement of the optical isolator is reduced.

In an implementation of this application, an included angle between the polarization direction of the first optical signal and the polarization direction of the second optical signal ranges from 40 degrees to 50 degrees. After passing through the polarizer, the first optical signal is transmitted to the optical rotator, and the first optical signal is deflected by 40 degrees to 50 degrees under the action of the optical rotator. Therefore, the first optical signal is converted into the second optical signal. In other words, the optical rotator can deflect an optical signal passing through the optical rotator by 40 degrees to 50 degrees. For the optical signal reflected by the polarization maintaining device, the reflected optical signal is transmitted to the optical rotator, and is deflected by 40 degrees to 50 degrees under the action of the optical rotator. Because the polarization direction of the optical signal reflected by the polarization maintaining device is the same as the polarization direction of the second optical signal, after the optical signal is deflected by the optical rotator by 40 degrees to 50 degrees, an included angle between the polarization direction of the optical signal and the polarization direction of the first optical signal ranges from 80 degrees to 100 degrees. In this way, the polarization direction of the optical signal is approximately perpendicular to the polarization direction of the polarizer, so that the polarizer can better absorb the optical signal, and an anti-interference effect of the optical isolator is improved.

In an implementation of this application, both the polarizer and the optical rotator are sheet-like structural members, and one side of the polarizer is attached to one side of the optical rotator, so that the polarizer and the optical rotator can be coupled to each other. One side that is of the polarizer and that is away from the optical rotator faces the laser, so that the side that is of the polarizer and that is away from the optical rotator faces the laser can be coupled to the laser, to receive the first optical signal emitted by the laser. One side that is of the optical rotator and that is away from the polarizer faces the polarization maintaining device, so that the side that is of the optical rotator and that is away from the polarizer can be coupled to the polarization maintaining device, to receive the optical signal reflected by the polarization maintaining device. In addition, the polarizer is attached to the optical rotator together, so that a volume of the optical isolator can be reduced, and a structure of the light-emitting assembly is more compact.

In an implementation of this application, after receiving the second optical signal, the polarization maintaining device reflects a part of the optical signal, where the part of the optical signal is a third optical signal, and the third optical signal is coupled to the optical rotator. After the third optical signal is transmitted to the optical rotator, the third optical signal is deflected into a fourth optical signal under the action of the optical rotator, and a polarization direction of the fourth optical signal is perpendicular to the polarization direction of the polarizer. In this way, because the polarization direction of the fourth optical signal is perpendicular to the polarization direction of the polarizer, the polarizer can absorb the fourth optical signal, to isolate the fourth optical signal, thereby preventing the fourth optical signal from interfering with the laser.

In an implementation of this application, the polarization maintaining device includes a substrate and a plurality of polarization maintaining optical fibers. One side of the substrate has a plurality of grooves, the plurality of grooves are sequentially arranged at intervals, and the grooves are in a one-to-one correspondence with the polarization maintaining optical fibers. The polarization maintaining optical fibers are inserted into the corresponding grooves, and one end of the polarization maintaining optical fiber is coupled to the optical isolator. According to such a design, the substrate is used to bear the plurality of polarization maintaining optical fibers, the grooves on the substrate are used to locate the polarization maintaining optical fibers, and the polarization maintaining optical fibers are used to receive the second optical signal and reflect the third optical signal whose polarization direction is the same as that of the second optical signal. In other words, the plurality of polarization maintaining optical fibers are arranged on the substrate at intervals, the first optical signal becomes the second optical signal after being deflected by the optical rotator, and the second optical signal is transmitted to each polarization maintaining optical fiber and received by each polarization maintaining optical fiber. The third optical signal reflected by each polarization maintaining optical fiber can be transmitted to the optical rotator, is deflected into the fourth optical signal under the action of the optical rotator, and is finally transmitted to the polarizer and absorbed by the polarizer.

In an implementation of this application, the laser includes a base and a plurality of light-emitting units. The plurality of light-emitting units are sequentially arranged at intervals, and are all connected to the base, the light-emitting units are in a one-to-one correspondence with the polarization maintaining optical fibers, and the light-emitting units are arranged opposite to the corresponding polarization maintaining optical fibers. According to such a design, the base is used to bear the plurality of light-emitting units, and the light-emitting units are used to emit the first optical signal. In other words, the plurality of light-emitting units are arranged on the base at intervals, the first optical signal emitted by each light-emitting unit passes through the polarizer and the optical rotator sequentially, and is deflected into the second optical signal under the action of the optical rotator, and the second optical signal is transmitted to each corresponding polarization maintaining optical fiber, to complete the optical signal emission process of the light-emitting assembly.

In an implementation of this application, the light-emitting assembly further includes a first lens array, and the first lens array is located between the laser and the optical isolator. The first lens array has a plurality of lens units, the lens units of the first lens array are in a one-to-one correspondence with the light-emitting units, and the lens unit of the first lens array is separately coupled to the optical isolator and the corresponding light-emitting unit. Because the lens units of the first lens array are in a one-to-one correspondence with the light-emitting units, the first lens array can collimate the first optical signal emitted by the light-emitting units, so that the collimated first optical signal can be efficiently coupled to the optical isolator, thereby reducing a loss of the first optical signal.

In an implementation of this application, the light-emitting assembly further includes a second lens array, and the second lens array is located between the polarization maintaining device and the optical isolator. The second lens array has a plurality of lens units, the lens units of the second lens array are in a one-to-one correspondence with the polarization maintaining optical fibers, and the lens unit of the second lens array is separately coupled to the optical isolator and the corresponding polarization maintaining optical fiber. Because the lens units of the second lens array are in a one-to-one correspondence with the polarization maintaining optical fibers, the first lens array can converge the second optical signal outputted by the optical isolator, so that the converged second optical signal can be accurately coupled to each polarization maintaining optical fiber, thereby reducing a loss of the second optical signal.

In an implementation of this application, the polarization maintaining device includes a first optical waveguide, where the first optical waveguide extends along a light output direction of the optical isolator, and an end of the first optical waveguide is coupled to the optical isolator. According to such a design, because the first optical waveguide extends along the light output direction of the optical isolator, the first optical waveguide can directly receive the second optical signal obtained by deflection of the optical isolator, and can also directly couple the reflected third optical signal to the optical isolator. Because the first optical waveguide has a characteristic of polarization maintaining, the polarization direction of the second optical signal received by the first optical waveguide is the same as a polarization direction of the reflected third optical signal.

In an implementation of this application, the light-emitting assembly further includes a first lens, where the first lens is located between the first optical waveguide and the optical isolator, and the first lens is separately coupled to the first optical waveguide and the optical isolator. According to such a design, because the first lens is separately coupled to the first optical waveguide and the optical isolator, the first lens can converge the second optical signal obtained by deflection of the optical isolator, to more accurately couple the second optical signal to the first optical waveguide. Alternatively, the first lens is located between the laser and the optical isolator, and the first lens is separately coupled to the laser and the optical isolator. According to such a design, because the first lens is separately coupled to the laser and the optical isolator, the first lens can converge the first optical signal emitted by the laser. After being deflected by the optical isolator, the converged first optical signal can be converted into the converged second optical signal, to be more accurately coupled to the first optical waveguide.

In an implementation of this application, the polarization maintaining device includes a second optical waveguide and a reflector, and an included angle exists between the second optical waveguide and the light output direction of the optical isolator. The reflector is located in the light output direction of the optical isolator, to couple the optical isolator to the second optical waveguide. According to such a design, because an included angle exists between the second optical waveguide and the light output direction of the optical isolator, the second optical waveguide cannot directly receive the second optical signal obtained by deflection of the optical isolator, and cannot directly couple the reflected third optical signal to the optical isolator. However, because the reflector is disposed between the second optical waveguide and the optical isolator, the second optical signal can be coupled to the second optical waveguide after being reflected by the reflector, and the third optical signal can also be coupled to the optical isolator after being reflected by the reflector.

In an implementation of this application, the light-emitting assembly further includes a second lens, the second lens is located between the reflector and the optical isolator, and the second lens is separately coupled to the reflector and the optical isolator. According to such a design, because the second lens is separately coupled to the reflector and the optical isolator, the second lens can converge the second optical signal obtained by deflection of the optical isolator, and more accurately couple the second optical signal to the second optical waveguide after the second optical signal is reflected by the reflector. Alternatively, the second lens is located between the laser and the optical isolator, and the second lens is separately coupled to the laser and the optical isolator. According to such a design, because the second lens is separately coupled to the laser and the optical isolator, the second lens can converge the first optical signal emitted by the laser. After being deflected by the optical isolator, the converged first optical signal can be converted into the converged second optical signal, and the converged second optical signal can be more accurately coupled to the second optical waveguide after being reflected by the reflector.

According to a second aspect, an optical communication apparatus is provided. The optical communication apparatus includes a board, a receive port, a transmit port, an onboard optical component, and the light-emitting assembly according to the first aspect. The receive port, the transmit port, the onboard optical component, and the light-emitting assembly are all connected to the board, and the receive port, the transmit port, and the light-emitting assembly are separately coupled to the onboard optical component. According to such a design, the receive port, the transmit port, the onboard optical component, and the light-emitting assembly are all integrated on the board. In an optical signal emission process, the light-emitting assembly sends an unmodulated optical signal, the optical signal is coupled to the onboard optical component, and the optical signal modulated by the onboard optical component is coupled to the transmit port, to complete the optical signal emission process. In an optical signal receiving process, the receive port receives an optical signal, couples the optical signal to the onboard optical component. After optical detection and photoelectric conversion in the onboard optical component, the optical signal receiving process is completed.

The optical communication apparatus provided in this embodiment of this application has at least the following effects:

In the entire optical signal emission process of the optical communication apparatus, because the light-emitting assembly is the light-emitting assembly according to the first aspect, the light-emitting assembly cannot only output an optical signal having a low loss, but also resist interference of an optical signal reflected in a channel.

DESCRIPTION OF REFERENCE NUMERALS

Figure 1:
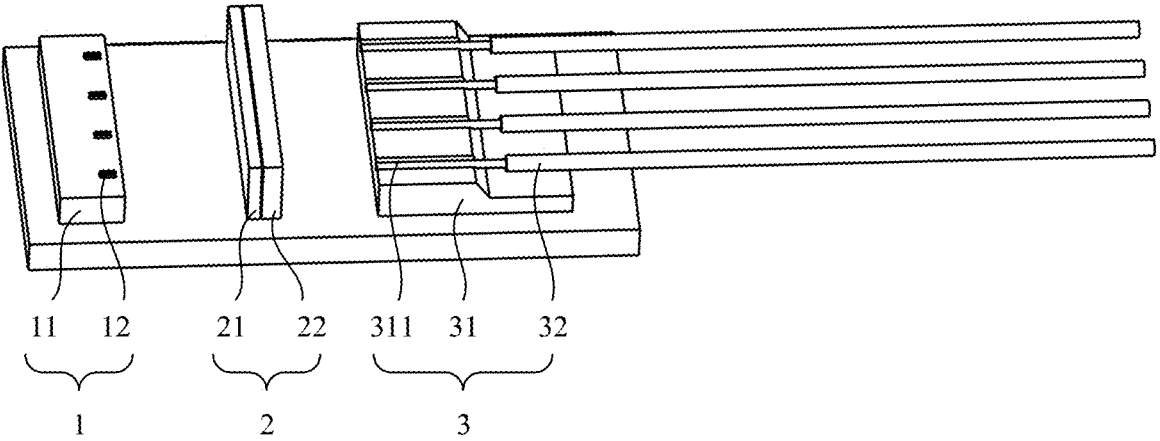
FIG. 1 is a schematic diagram of a structure of a light-emitting assembly according to an embodiment of this application.

1. Laser;
11. Base; 12. Light-emitting unit;

2. Optical isolator;

21. Polarizer; 22. Optical rotator;

3. Polarization maintaining device;

31. Substrate; 311. Groove; 32. Polarization maintaining optical fiber; 33. First optical waveguide; 34. Second optical waveguide; 35. Reflector;

4. First lens array;

5. Second lens array;

6. First lens;

7. Second lens;

a. First optical signal; b. Second optical signal; c. Third optical signal; d. Fourth optical signal;

100. Board; 200. Receive port; 300. Transmit port; 400. Onboard optical component; 410. Electrical switching chip; 420. Silicon optical chip; 430. Carrier; 500. Light-emitting assembly.

DETAILED DESCRIPTION OF ILLUSTRATIVE EMBODIMENTS

Terms used in implementations of this application are merely used to explain embodiments of this application rather than limit this application.

An optical isolator is one of important components of a light-emitting assembly, and the optical isolator is mainly configured to form a unidirectionally conductive optical path. In this way, it can be ensured that the light-emitting assembly outputs an optical signal having a low loss, and it can also be ensured that the light-emitting assembly resists interference of an optical signal reflected in a channel.

In a related technology, the optical isolator mainly includes a polarizer, an optical rotator, and a polarization analyzer, and the polarizer, the optical rotator, and the polarization analyzer are sequentially arranged. A polarization direction of an optical signal transmitted from the polarizer to the polarization analyzer is the same as a polarization direction of the polarizer, and the optical signal can pass through the polarizer in a lossless manner and be transmitted to the optical rotator. The optical rotator can deflect, under an action of an external magnetic field, a polarization direction of an optical signal that passes through the optical rotator by a specific angle, so that a polarization direction of the deflected optical signal is the same as a polarization direction of the polarization analyzer, so that the optical signal passes through the polarization analyzer in a lossless manner, that is, passes through the optical isolator. For an optical signal transmitted from the polarization analyzer to the polarizer, when the optical signal passes through the polarization analyzer, under an action of the polarization analyzer, only a component whose polarization angle is the same as that of the polarization analyzer can pass through the polarization analyzer. Under an action of the optical rotator, a polarization direction of the optical signal component passing through the polarization analyzer is deflected by a specific angle, and is transmitted to the polarizer. Because a polarization direction of the deflected optical signal component is perpendicular to the polarization direction of the polarizer, the polarizer absorbs the optical signal component, that is, the optical signal component is isolated by the optical isolator.

It can be learned that, in the related technology, the polarizer, the optical rotator, and the polarization analyzer work together, so that the optical isolator can allow an optical signal to pass through the optical isolator from the polarizer to the polarization analyzer, but does not allow an optical signal to pass through the optical isolator from the polarization analyzer to the polarizer, so that a unidirectionally conductive optical path is formed in the light-emitting assembly by using the optical isolator.

However, the foregoing optical isolator has a complex structure, resulting in high manufacturing costs, and a use effect of the optical isolator is limited by assembly precision.

To resolve the foregoing technical problem, an embodiment of this application provides a light-emitting assembly. FIG. 1 is a schematic diagram of a structure of the light-emitting assembly. Refer to FIG. 1, the light-emitting assembly includes a laser 1, an optical isolator 2, and a polarization maintaining device 3.

The laser 1 is configured to emit a first optical signal a, and the polarization maintaining device 3 is configured to receive a second optical signal b. The optical isolator 2 includes a polarizer 21 and an optical rotator 22. The laser 1, the polarizer 21, the optical rotator 22, and the polarization maintaining device 3 are sequentially arranged. A polarization direction of the polarizer 21 is the same as a polarization direction of the first optical signal a. The optical rotator 22 is configured to deflect the first optical signal a into the second optical signal b.

Figure 2:
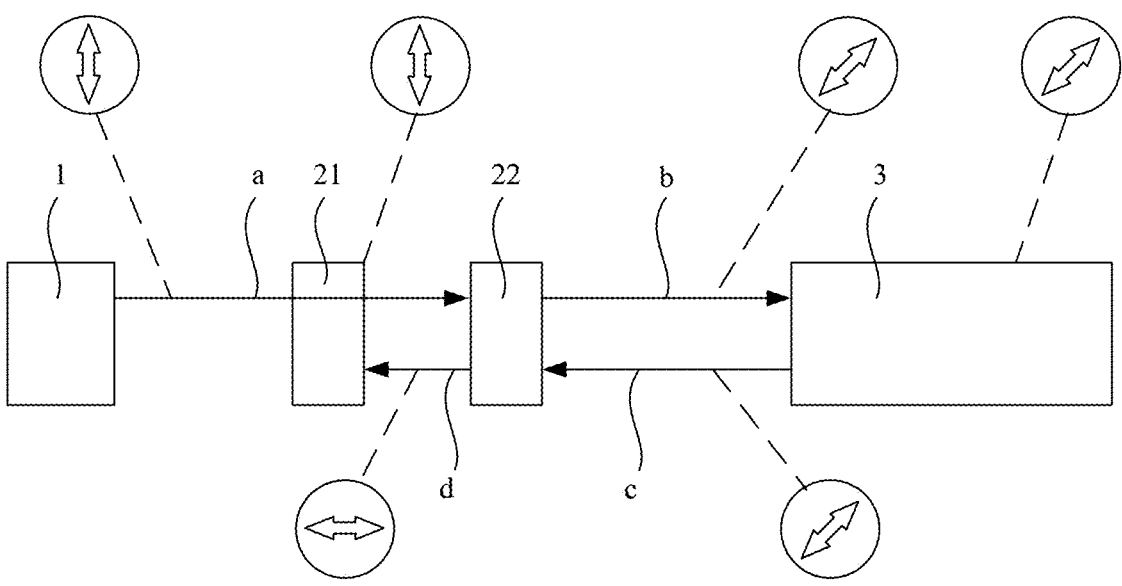
FIG. 2 is a schematic diagram of an optical path of a light-emitting assembly according to an embodiment of this application.

FIG. 2 is a schematic diagram of an optical path of the light-emitting assembly. With reference to FIG. 2, after the laser 1 emits the first optical signal a, the first optical signal a is transmitted to the polarizer 21. Because the polarization direction of the polarizer 21 is the same as the polarization direction of the first optical signal a, the first optical signal a can pass through the polarizer 21 in a lossless manner. After the first optical signal a passes through the polarizer 21, the first optical signal a is transmitted to the optical rotator 22. The first optical signal a is deflected into the second optical signal b under an action of the optical rotator 22, and the second optical signal b is transmitted to the polarization maintaining device 3, to be received by the polarization maintaining device 3. Therefore, an entire optical signal emission process of the light-emitting assembly is completed.

Still with reference to FIG. 2, in the optical signal emission process, a part of an optical signal is reflected by the polarization maintaining device 3, and a polarization direction of the reflected optical signal is the same as a polarization direction of the second optical signal b. The reflected optical signal is transmitted to the optical rotator 22, and is deflected under the action of the optical rotator 22. The deflected optical signal is transmitted to the polarizer 21. Because a polarization direction of the optical signal is different from that of the polarizer 21, the polarizer 21 absorbs the optical signal, to isolate the optical signal, thereby preventing the optical signal from interfering with the laser 1.

It should be noted that a hollow bidirectional arrow is merely used as an example of a polarization direction, to compare polarization directions between components.

It can be learned that the light-emitting assembly provided in this embodiment of this application can ensure that an optical signal having a low loss is outputted, and can also ensure that interference of a reflected optical signal is resisted. In addition, because the optical isolator 2 includes only the polarizer 21 and the optical rotator 22, the optical isolator has a simple structure and a low requirement on assembly precision.

It should be further noted that, in this embodiment, no polarization analyzer exists between the optical rotator 22 and the polarization maintaining device 3. In other words, compared with an optical isolator having a polarizer, an optical rotator, and a polarization analyzer in a related technology, the optical isolator 2 provided in this embodiment of this application includes only the polarizer 21 and the optical rotator 22 and does not include the polarization analyzer. In this way, a concise structure of the optical isolator 2 is ensured. During assembly, only assembly precision between the polarizer 21 and the optical rotator 22 needs to be considered, so that an assembly requirement of the optical isolator 2 is reduced.

In this embodiment, the first optical signal a is deflected into the second optical signal b under the action of the optical rotator 22, and an included angle between the polarization direction of the first optical signal a and the polarization direction of the second optical signal b ranges from 40 degrees to 50 degrees.

In an entire process in which the first optical signal a passes through the optical isolator 2, after passing through the polarizer 21, the first optical signal a is transmitted to the optical rotator 22, and the first optical signal a is deflected by 40 degrees to 50 degrees under the action of the optical rotator 22. Therefore, the first optical signal a is converted into the second optical signal b. In other words, the optical rotator 22 can deflect an optical signal passing through the optical rotator 22 by 40 degrees to 50 degrees. For the optical signal reflected by the polarization maintaining device 3, the reflected optical signal is transmitted to the optical rotator 22, and is deflected by 40 degrees to 50 degrees under the action of the optical rotator 22. Because the polarization direction of the optical signal reflected by the polarization maintaining device 3 is the same as the polarization direction of the second optical signal b, after the optical signal is deflected by the optical rotator 22 by 40 degrees to 50 degrees, an included angle between the polarization direction of the optical signal and the polarization direction of the first optical signal a ranges from 80 degrees to 100 degrees. In this way, the polarization direction of the optical signal is approximately perpendicular to the polarization direction of the polarizer 21, so that the polarizer 21 can better absorb the optical signal, and an anti-interference effect of the optical isolator 2 is improved.

It can be learned that, a deflection angle value of the optical rotator 22 for a polarization direction of an optical signal passing through the optical rotator 22 determines whether a polarization angle of the second optical signal b is the same as a polarization angle of the polarization maintaining device 3, and determines an absorption effect of the polarizer 21 in absorbing the optical signal reflected by the polarization maintaining device 3, that is, isolation of the optical isolator 2. The isolation refers to a ratio of an insertion loss IL1 of an optical signal passing through an interface, a component, or a system in one direction to an insertion loss IL2 of the optical signal passing through the interface, the component, or the system in an opposite direction. The insertion loss refers to an energy loss when an optical signal passes through an interface, a component, or a system.

For example, the isolation of the optical isolator 2 directly affects a return loss RL (which is a ratio of reflected energy to incident energy when an optical signal passes through an interface, a component, or a system, and a unit thereof is dB) of the light-emitting assembly. To ensure that the return loss of the light-emitting assembly is greater than 20 dB, the included angle between the polarization direction of the first optical signal a and the polarization direction of the second optical signal b ranges from 42 degrees to 48 degrees, that is, the optical rotator 22 can deflect an optical signal passing through the optical rotator 22 by 42 degrees to 48 degrees. Certainly, when the included angle between the polarization direction of the first optical signal a and the polarization direction of the second optical signal b is 45 degrees, that is, when the optical rotator 22 can deflect an optical signal passing through the optical rotator 22 by 45 degrees, the polarization direction of the optical signal reflected by the polarization maintaining device 3 is exactly perpendicular to the polarization direction of the polarizer 21. In this case, the polarizer 21 can absorb all optical signals reflected by the polarization maintaining device 3, thereby achieving optimal isolation.

It may be learned from the foregoing that the optical isolator 2 can form a unidirectionally conductive optical path in the light-emitting assembly because the optical isolator 2 can absorb and isolate the optical signal reflected by the polarization maintaining device 3. The following further describes a manner in which the optical isolator 2 absorbs the optical signal reflected by the polarization maintaining device 3.

Still with reference to FIG. 2, in this embodiment, a third optical signal c reflected by the polarization maintaining device 3 is coupled to the optical rotator 22, and the optical rotator 22 is configured to deflect the third optical signal c into a fourth optical signal d, where a polarization direction of the fourth optical signal d is perpendicular to the polarization direction of the polarizer 21.

After receiving the second optical signal b, the polarization maintaining device 3 reflects a part of the optical signal, where the part of the optical signal is the third optical signal c, and the third optical signal c is coupled to the optical rotator 22. In the foregoing implementation, the optical rotator 22 can deflect an optical signal passing through the optical rotator 22 by 45 degrees. Therefore, after the third optical signal c is transmitted to the optical rotator 22, the third optical signal c is deflected into the fourth optical signal d under the action of the optical rotator 22. In addition, the polarization direction of the fourth optical signal d is perpendicular to the polarization direction of the polarizer 21. In this way, because the polarization direction of the fourth optical signal d is perpendicular to the polarization direction of the polarizer 21, the polarizer 21 can absorb the fourth optical signal d, to isolate the fourth optical signal, thereby preventing the fourth optical signal d from interfering with the laser 1.

In conclusion, the polarization direction of the first optical signal a is the same as the polarization direction of the polarizer 21, and the polarization direction of the second optical signal b is the same as the polarization direction of the third optical signal c. It is assumed that the optical rotator 22 can deflect an optical signal passing through the optical rotator 22 by 45 degrees. In this case, the included angle between the polarization direction of the second optical signal b and the polarization direction of the first optical signal a is 45 degrees, and an included angle between the polarization direction of the fourth optical signal d and the polarization direction of the third optical signal c is 45 degrees. In other words, an included angle between the polarization direction of the fourth optical signal d and the polarization direction of the polarizer 21 is 90 degrees.

The following describes a structure of the optical isolator 2 with reference to FIG. 1 again.

In this embodiment, the polarizer 21 is attached to the optical rotator 22, and one side that is of the polarizer 21 and that is away from the optical rotator 22 faces the laser 1, to be coupled to the laser 1. One side that is of the optical rotator 22 and that is away from the polarizer 21 faces the polarization maintaining device 3, to be coupled to the polarization maintaining device 3.

In the foregoing implementations, both the polarizer 21 and the optical rotator 22 are sheet-like structural members. The polarizer 21 is attached to the optical rotator 22 together, so that a volume of the optical isolator 2 can be reduced, and a structure of the light-emitting assembly is more compact.

In an implementation of this embodiment, the polarizer 21 is a nano-metal wire absorption polarizer 21, and is manufactured by evenly doping nano-metal (silver, copper, or the like) wire structures having a consistent direction into infrared glass by using a process such as glass melting, stretching, and reduction. When an optical signal passes through the polarizer 21, a component whose direction is consistent with that of the nano-metal wire is absorbed, and a component whose direction is perpendicular to that of the nano-metal wire may pass through in a lossless manner. The polarizer 21 has characteristics of a small insertion loss and a large polarization extinction ratio.

In an implementation of this embodiment, a material of the optical rotator 22 is an yttrium iron garnet crystal doped with a rare earth element such as Bi, so that the optical rotator 22 has characteristics of a low insertion loss and a high optical rotation coefficient. A magnetic domain structure of a special structure is formed under an action of cooperating with an external magnetic field (or a magnetic material may be doped into the crystal of the optical rotator 22, so that the optical rotator 22 has a magnetic field, and no external magnetic field needs to be added), so that a polarization direction of a passed optical signal is deflected to a direction. It should be noted that a deflection direction of the polarization direction of the optical signal is related to the magnetic domain structure, and is determined by a crystal structure and a magnetic field, but is irrelevant to a propagation direction of light. Therefore, although a direction in which the first optical signal a passes through the optical rotator 22 is different from a propagation direction in which the third optical signal c passes through the optical rotator 22, the polarization directions of the first optical signal a and the third optical signal c are deflected in a same direction.

In a specific magnetic field, a deflection angle is proportional to a thickness of the optical rotator 22, and meets the following formula:

$$\theta = vHd \qquad (1)$$

$\theta$ is a deflection angle of the optical rotator 22, v is an optical rotation coefficient, the optical rotation coefficient is determined by the material of the optical rotator 22, H is an external magnetic field strength, and d is the thickness of the optical rotator 22.

In this embodiment, the deflection angle $\theta$ of the optical rotator 22 is 45 degrees. In this case, the return loss of the light-emitting assembly is greater than 20 dB, and an insertion loss is less than 0.2 dB, so that it can be ensured that an optical signal having a low loss is outputted, and it can also be ensured that interference of a reflected optical signal is resisted. Compared with an optical isolator having a polarizer, an optical rotator, and a polarization analyzer, because the polarization analyzer is omitted, a size is reduced by 30%, costs are reduced by 30%, required assembly precision is reduced, and efficiency of an assembly process is improved by 40%. In addition, while the polarization analyzer is omitted, glue used for bonding the polarization analyzer is also omitted, so that a coupling insertion loss is also reduced by 0.1 dB.

It can be learned from the foregoing that a feature of the polarization maintaining device 3 determines that the polarization direction of the third optical signal c is the same as the polarization direction of the second optical signal b. Embodiments of this application provide a plurality of structure forms of the polarization maintaining device 3, and correspondingly provide a plurality of structure forms of the light-emitting assembly based on different structure forms of the polarization maintaining device 3. Descriptions are separately provided as follows.

Figure 3:
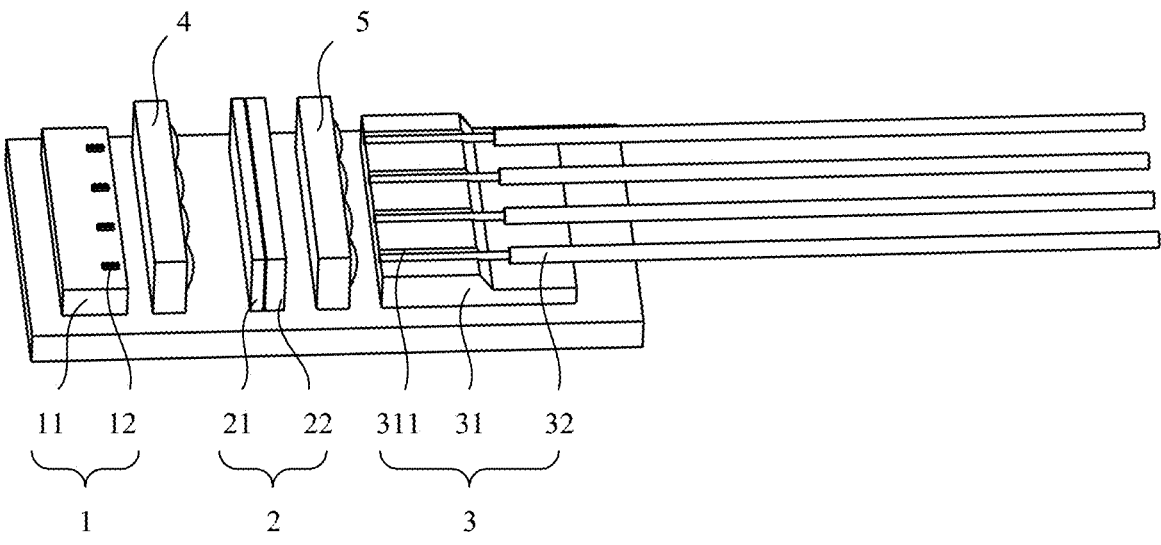
FIG. 3 is a schematic diagram of a structure of a first structure form of a polarization maintaining device according to an embodiment of this application.

FIG. 3 is a schematic diagram of a structure of a first structure form of a polarization maintaining device 3. With reference to FIG. 3, the polarization maintaining device 3 includes a substrate 31 and a plurality of polarization maintaining optical fibers 32. One side of the substrate 31 has a plurality of grooves 311, the plurality of grooves 311 are sequentially arranged at intervals, the grooves 311 are in a one-to-one correspondence with the polarization maintaining optical fibers 32, the polarization maintaining optical fibers 32 are inserted into the corresponding grooves 311, and one end of the polarization maintaining optical fiber 32 is coupled to the optical isolator 2.

In the foregoing implementation, the substrate 31 is used to bear the plurality of polarization maintaining optical fibers 32, the grooves 311 on the substrate 31 are used to locate the polarization maintaining optical fibers 32, the polarization maintaining optical fibers 32 are used to receive the second optical signal b and reflect the third optical signal c whose deflection direction is the same as that of the second optical signal b.

In other words, the plurality of polarization maintaining optical fibers 32 are arranged on the substrate 31 at intervals, the first optical signal a becomes the second optical signal b after being deflected by the optical rotator 22, and the second optical signal b is transmitted to each polarization maintaining optical fiber 32 and received by each polarization maintaining optical fiber 32. The third optical signal c reflected by each polarization maintaining optical fiber 32 can be transmitted to the optical rotator 22, is deflected into the fourth optical signal d under the action of the optical rotator 22, and is finally transmitted to the polarizer 21 and absorbed by the polarizer 21.

The substrate 31 is a structural member made of materials such as glass, metal, ceramic, and silicon, and can effectively and stably support an optical fiber.

The polarization maintaining optical fiber 32 is an optical fiber having a special structure inside, and uses an asymmetrical internal stress to ensure that a polarization direction of an optical signal transmitted in the optical fiber does not change.

With reference to FIG. 3, in this embodiment, the laser 1 includes a base 11 and a plurality of light-emitting units 12. The plurality of light-emitting units 12 are sequentially arranged at intervals, and are all connected to the base 11, the light-emitting units 12 are in a one-to-one correspondence with the polarization maintaining optical fibers 32, and the light-emitting units 12 are arranged opposite to the corresponding polarization maintaining optical fibers 32.

In the foregoing implementation, the light-emitting units 12 are connected to the base 11 by using a bonding or welding process, the base 11 is used to bear the plurality of light-emitting units 12, and the light-emitting units 12 are used to emit the first optical signal a. In other words, the plurality of light-emitting units 12 are arranged on the base 11 at intervals. The first optical signal an emitted by each light-emitting unit 12 passes through the polarizer 21 and the optical rotator 22 sequentially, and is deflected into the second optical signal b under the action of the optical rotator 22, and the second optical signal b is transmitted to each corresponding polarization maintaining optical fiber 32, to complete the optical signal emission process of the light-emitting assembly.

In this embodiment, the light-emitting units 12 perform frequency selection by using stimulated radiation of a solid semiconductor and a resonant cavity, and emit the first optical signal a with a specific wavelength and a specific polarization direction. For example, the first optical signal a is linearly polarized light, and a polarization direction is a horizontal direction.

Still with reference to FIG. 3, in an implementation of this embodiment, the light-emitting assembly further includes a first lens array 4, where the first lens array 4 is located between the laser 1 and the optical isolator 2, lens units of the first lens array 4 are in a one-to-one correspondence with the light-emitting units 12, and the lens unit of the first lens array 4 is separately coupled to the optical isolator 2 and the corresponding light-emitting unit 12.

Because the lens units of the first lens array 4 are in a one-to-one correspondence with the light-emitting units 12, the first lens array 4 can collimate the first optical signal an emitted by the light-emitting units 12, so that the collimated first optical signal a can be efficiently coupled to the optical isolator 2, thereby reducing a loss of the first optical signal a.

The first lens array 4 is a structural member that has a special surface shape and that is formed by processing silicon, a polymer material, glass, or another medium material by using a process such as injection molding, mechanical grinding, stamping, photoetching, and mold pressing. A surface of the first lens array 4 is plated with an anti-reflective coating, to reduce reflection of the first lens array 4.

Still with reference to FIG. 3, in an implementation of this embodiment, the light-emitting assembly further includes a second lens array 5, the second lens array 5 is located between the polarization maintaining device 3 and the optical isolator 2, lens units of the second lens array 5 are in a one-to-one correspondence with the polarization maintaining optical fibers 32, and the lens unit of the second lens array 5 is separately coupled to the optical isolator 2 and the corresponding polarization maintaining optical fiber 32.

Because the lens units of the second lens array 5 are in a one-to-one correspondence with the polarization maintaining optical fibers 32, the first lens array 4 can converge the second optical signal b outputted by the optical isolator 2, so that the converged second optical signal b can be accurately coupled to each polarization maintaining optical fiber 32, thereby reducing a loss of the second optical signal b.

The second lens array 5 is a structural member that has a special surface shape and that is formed by processing silicon, a polymer material, glass, or another medium material by using a process such as injection molding, mechanical grinding, stamping, photoetching, and mold pressing. A surface of the second lens array 5 is plated with an anti-reflective coating, to reduce reflection of the second lens array 5.

Figure 4:
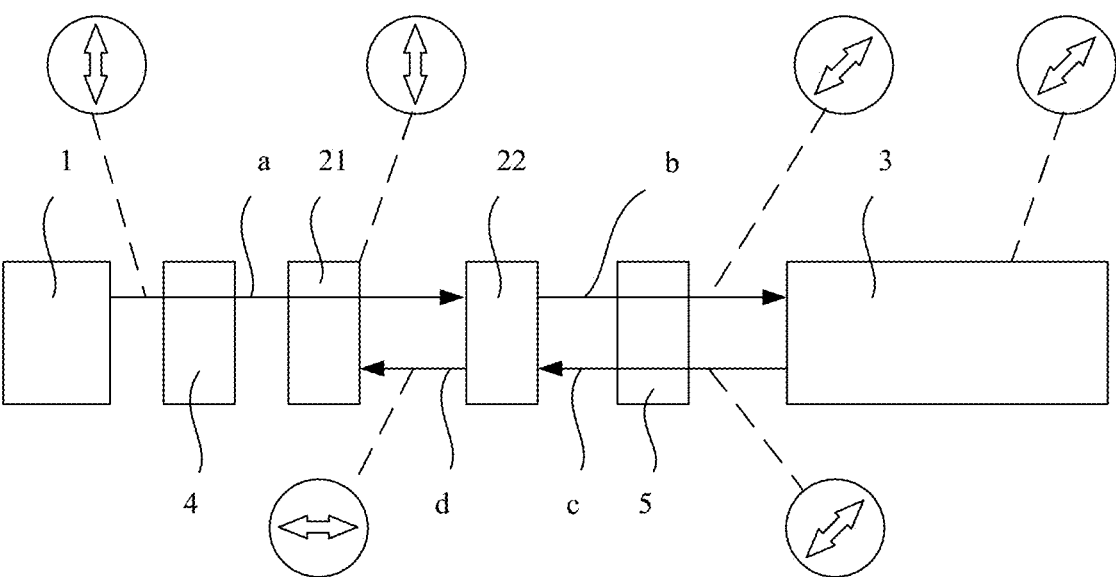
FIG. 4 is a schematic diagram of an optical path of a first structure form of a polarization maintaining device according to an embodiment of this application.

FIG. 4 is a schematic diagram of an optical path of a first structure form of a polarization maintaining device 3. With reference to FIG. 4, the optical path of the first structure form of the polarization maintaining device 3 is described.

In an optical signal emission process, after the laser 1 emits the first optical signal a, the first optical signal a is transmitted to the first lens array 4, and is collimated under an action of the first lens array 4, to be efficiently coupled to the polarizer 21. Because the polarization direction of the polarizer 21 is the same as the polarization direction of the first optical signal a, the first optical signal a can pass through the polarizer 21 in a lossless manner. After the first optical signal a passes through the polarizer 21, the first optical signal a is transmitted to the optical rotator 22. The first optical signal a is deflected into the second optical signal b under the action of the optical rotator 22, and is further transmitted to the second lens array 5. After being transmitted to the second lens array 5, the second optical signal b is converged under an action of the second lens array 5, to be accurately coupled to the polarization maintaining optical fibers 32, to be received by the polarization maintaining optical fibers 32. Therefore, the entire optical signal emission process of the light-emitting assembly is completed.

In an optical signal reflection process, the third optical signal c is reflected by the polarization maintaining optical fibers 32, and is transmitted to the optical rotator 22 through the second lens array 5. The third optical signal c is deflected into the fourth optical signal d under the action of the optical rotator 22, and the fourth optical signal d is transmitted to the polarizer 21, and is absorbed by the polarizer 21.

Figure 5:
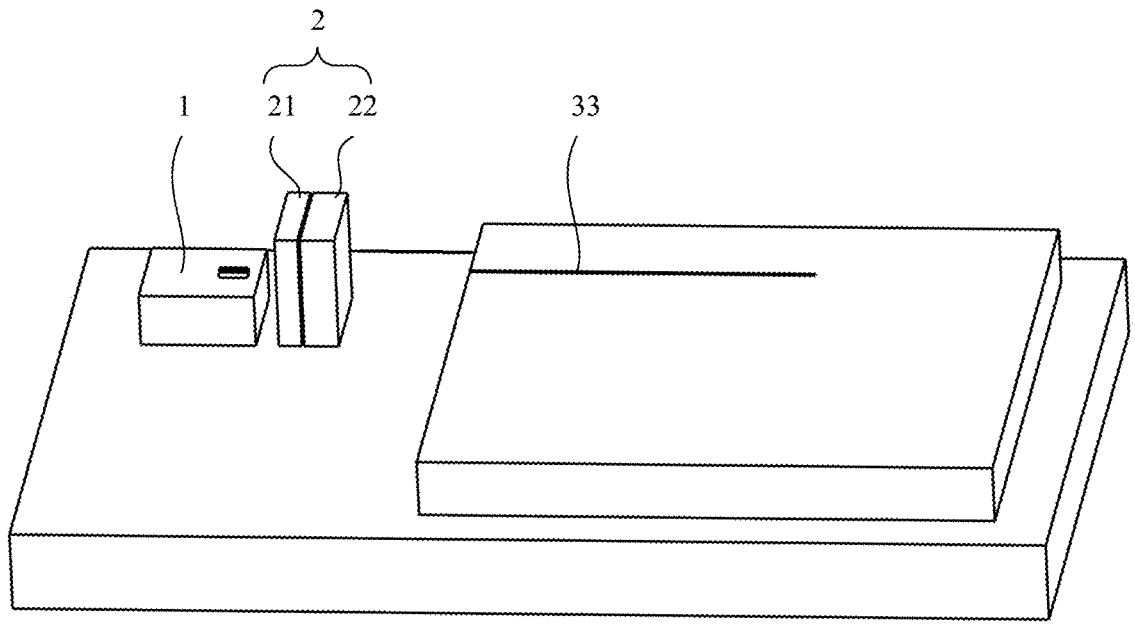
FIG. 5 is a schematic diagram of a structure of a second structure form of a polarization maintaining device according to an embodiment of this application.

FIG. 5 is a schematic diagram of a structure of a second structure form of a polarization maintaining device 3. With reference to FIG. 5, in this embodiment, the polarization maintaining device 3 includes a first optical waveguide 33. The first optical waveguide 33 extends along a light output direction of the optical isolator 2, and an end of the first optical waveguide 33 is coupled to the optical isolator 2.

Figure 6:
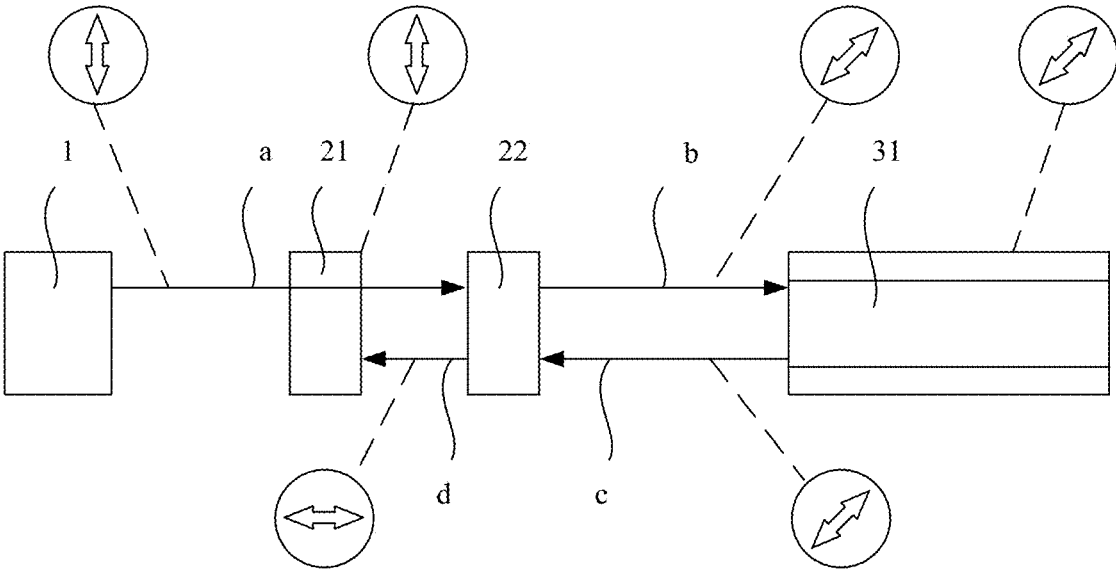
FIG. 6 is a schematic diagram of an optical path of a second structure form of a polarization maintaining device according to an embodiment of this application.

FIG. 6 is a schematic diagram of an optical path of a second structure form of the polarization maintaining device 3. With reference to FIG. 6, because the first optical waveguide 33 extends along the light output direction of the optical isolator 2, the first optical waveguide 33 can directly receive the second optical signal b obtained by deflection of the optical isolator 2, and can also directly couple the reflected third optical signal c to the optical isolator 2. Because the first optical waveguide 33 has a characteristic of polarization maintaining, the polarization direction of the second optical signal b received by the first optical waveguide 33 is the same as the polarization direction of the reflected third optical signal c.

Figure 7:
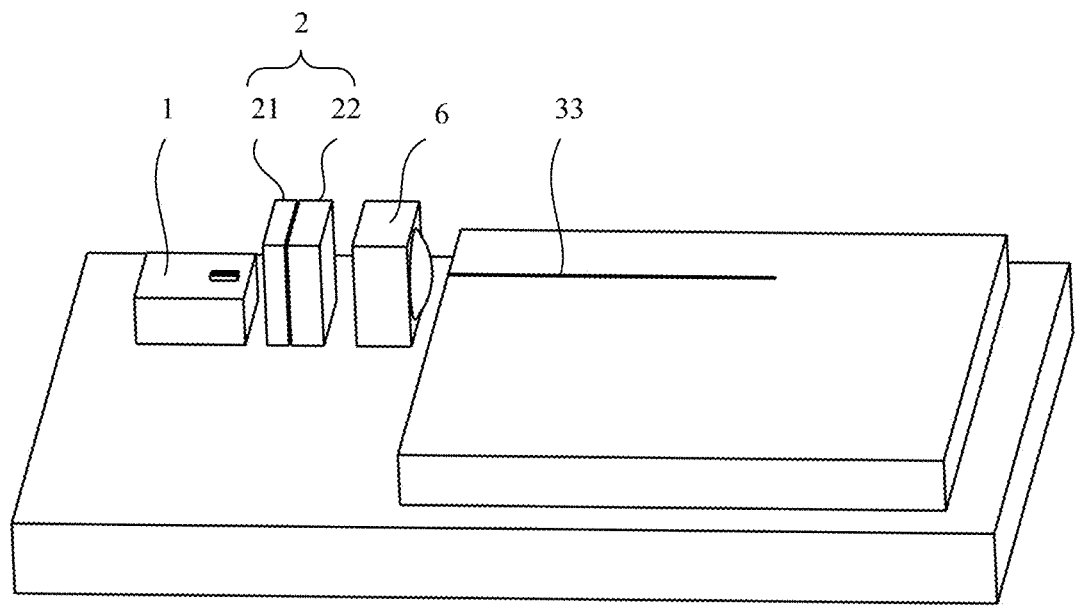
FIG. 7 is a schematic diagram of a structure of a second structure form of a polarization maintaining device according to an embodiment of this application.

FIG. 7 is a schematic diagram of a structure of a second structure form of a polarization maintaining device 3. A difference between FIG. 7 and FIG. 5 lies in that a first lens 6 is disposed in FIG. 7. With reference to FIG. 7, in an implementation of this embodiment, the light-emitting assembly further includes the first lens 6, the first lens 6 is located between the first optical waveguide 33 and the optical isolator 2, and the first lens 6 is separately coupled to the first optical waveguide 33 and the optical isolator 2; or the first lens 6 is located between the laser 1 and the optical isolator 2, and the first lens 6 is separately coupled to the laser 1 and the optical isolator 2.

When the first lens 6 is located between the first optical waveguide 33 and the optical isolator 2, because the first lens 6 is separately coupled to the first optical waveguide 33 and the optical isolator 2, the first lens 6 can converge the second optical signal b obtained by deflection of the optical isolator 2, to more accurately couple the second optical signal to the first optical waveguide 33.

When the first lens 6 is located between the laser 1 and the optical isolator 2, because the first lens 6 is separately coupled to the laser 1 and the optical isolator 2, the first lens 6 can converge the first optical signal an emitted by the laser 1. After being deflected by the optical isolator 2, the converged first optical signal a can be converted into the converged second optical signal b, to be more accurately coupled to the first optical waveguide 33.

In other words, regardless of whether the first lens 6 is located between the first optical waveguide 33 and the optical isolator 2 or located between the laser 1 and the optical isolator 2, coupling efficiency of an optical signal can be improved.

Figure 8:
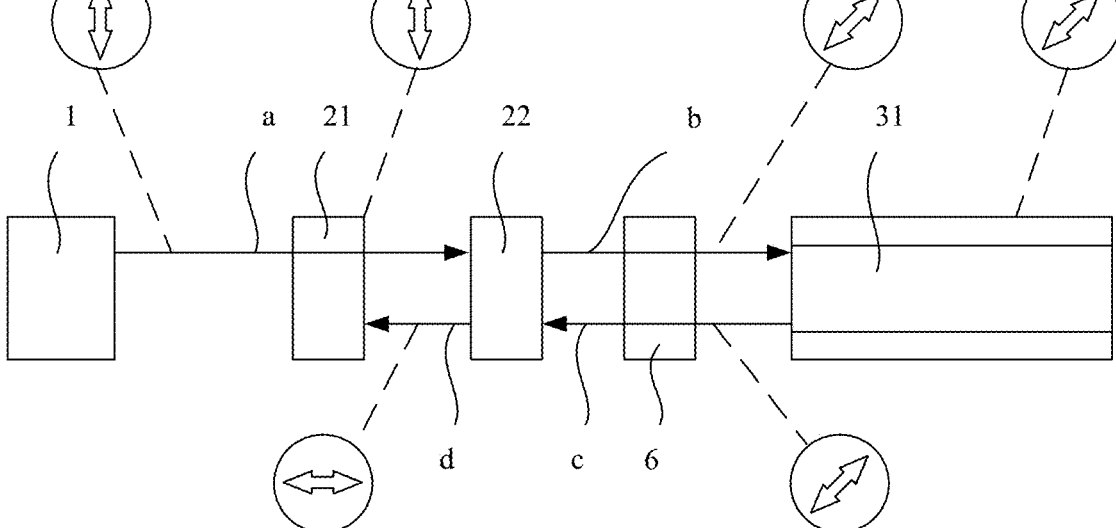
FIG. 8 is a schematic diagram of an optical path of a second structure form of a polarization maintaining device according to an embodiment of this application.

FIG. 8 is a schematic diagram of an optical path of a second structure form of a polarization maintaining device 3. With reference to FIG. 8, the optical path of the second structure form of the polarization maintaining device 3 is described.

In an optical signal emission process, after the laser 1 emits the first optical signal a, the first optical signal a is transmitted to the polarizer 21. Because the polarization direction of the polarizer 21 is the same as the polarization direction of the first optical signal a, the first optical signal a can pass through the polarizer 21 in a lossless manner. After the first optical signal a passes through the polarizer 21, the first optical signal a is transmitted to the optical rotator 22. The first optical signal a is deflected into the second optical signal b under the action of the optical rotator 22, and is further transmitted to the first lens 6. After being transmitted to the first lens 6, the second optical signal b is converged under an action of the first lens 6, to be accurately coupled to the first optical waveguide 33, to be received by the first optical waveguide 33. Therefore, the entire optical signal emission process of the light-emitting assembly is completed.

In an optical signal reflection process, the third optical signal c is reflected by the first optical waveguide 33, and is transmitted to the optical rotator 22 through the first lens 6. The third optical signal c is deflected into the fourth optical signal d under the action of the optical rotator 22, and the fourth optical signal d is transmitted to the polarizer 21, and is absorbed by the polarizer 21.

Figure 9:
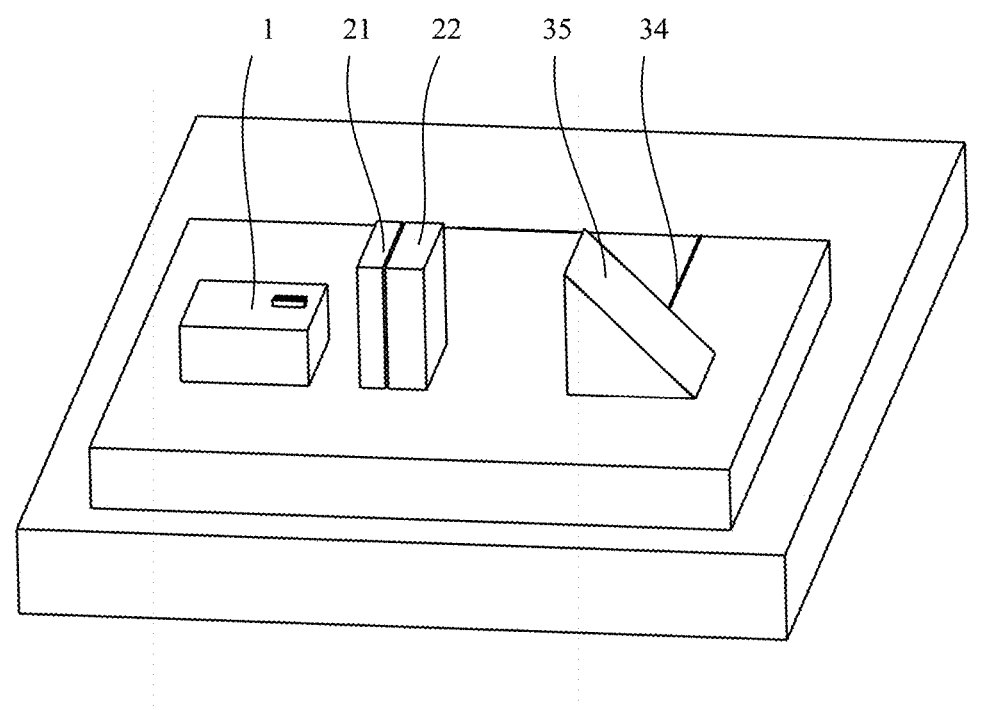
FIG. 9 is a schematic diagram of a structure of a third structure form of a polarization maintaining device according to an embodiment of this application.

FIG. 9 is a schematic diagram of a structure of a third structure form of a polarization maintaining device 3. With reference to FIG. 9, in this embodiment, the polarization maintaining device 3 includes a second optical waveguide 34 and a reflector 35. An included angle exists between the second optical waveguide 34 and the light output direction of the optical isolator 2, and the reflector 35 is located in the light output direction of the optical isolator 2, to couple the optical isolator 2 to the second optical waveguide 34.

Figure 10:
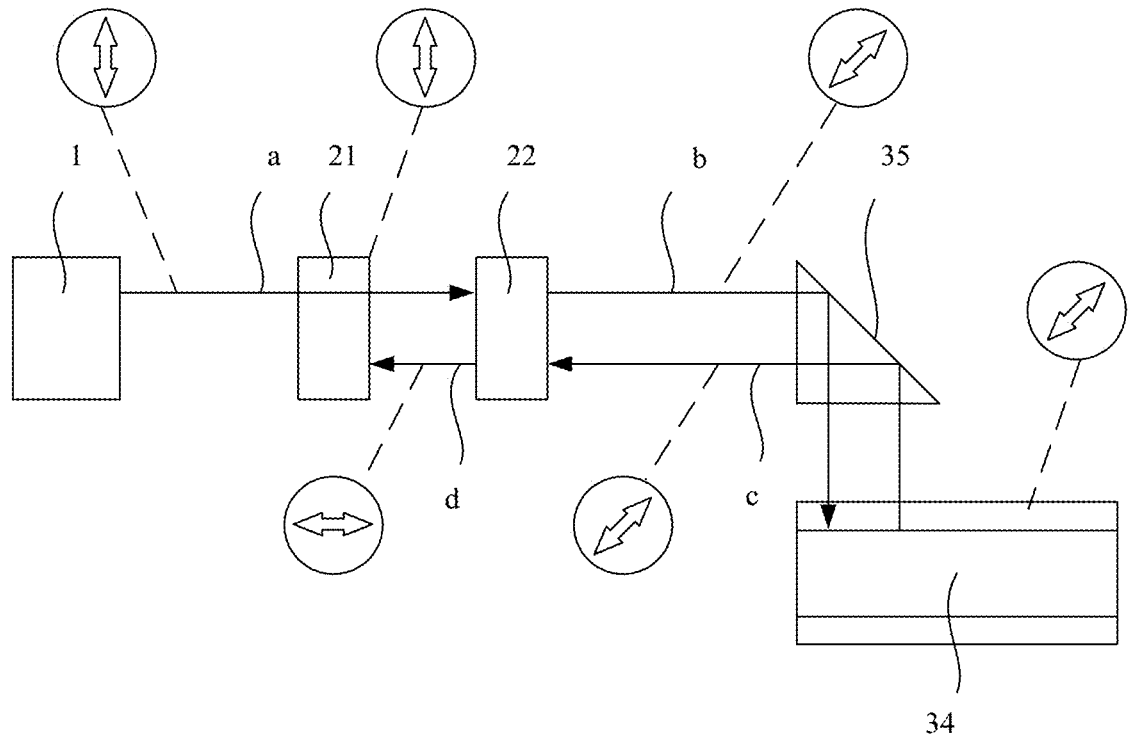
FIG. 10 is a schematic diagram of an optical path of a third structure form of a polarization maintaining device according to an embodiment of this application.

FIG. 10 is a schematic diagram of an optical path of a third structure form of a polarization maintaining device 3. With reference to FIG. 10, because an included angle exists between the second optical waveguide 34 and the light output direction of the optical isolator 2, the second optical waveguide 34 cannot directly receive the second optical signal b obtained by deflection of the optical isolator 2, and cannot directly couple the reflected third optical signal c to the optical isolator 2. However, because the reflector 35 is disposed between the second optical waveguide 34 and the optical isolator 2, the second optical signal b can be coupled to the second optical waveguide 34 after being reflected by the reflector 35, and the third optical signal c can also be coupled to the optical isolator 2 after being reflected by the reflector 35.

Figure 11:
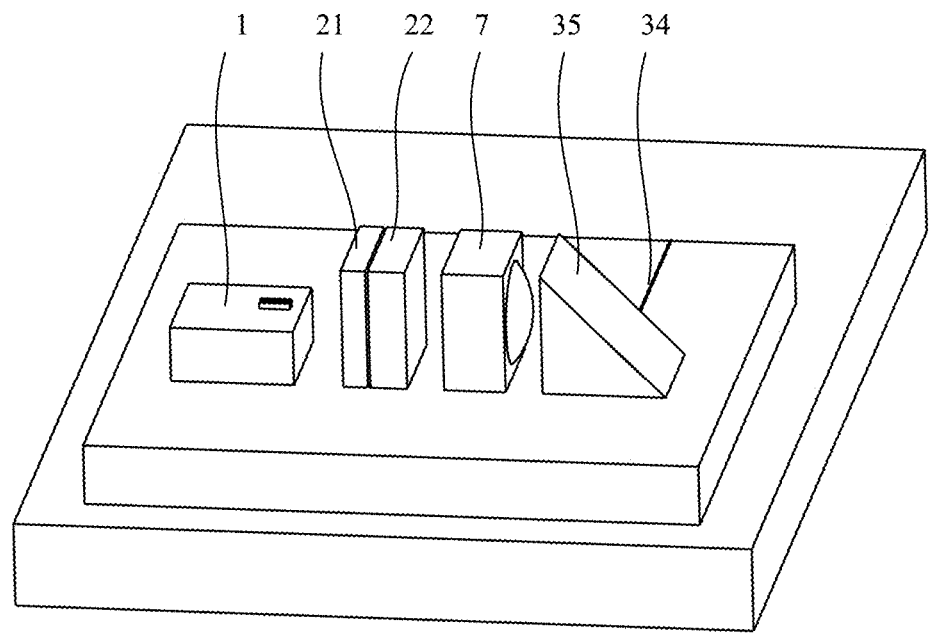
FIG. 11 is a schematic diagram of a structure of a third structure form of a polarization maintaining device according to an embodiment of this application.

FIG. 11 is a schematic diagram of a structure of a third structure form of a polarization maintaining device 3. A difference between FIG. 11 and FIG. 9 lies in that a second lens 7 is disposed in FIG. 11. With reference to FIG. 11, in an implementation of this embodiment, the light-emitting assembly further includes the second lens 7, the second lens 7 is located between the reflector 35 and the optical isolator 2, and the second lens 7 is separately coupled to the reflector 35 and the optical isolator 2; or the second lens 7 is located between the laser 1 and the optical isolator 2, and the second lens 7 is separately coupled to the laser 1 and the optical isolator 2.

When the second lens 7 is located between the reflector 35 and the optical isolator 2, because the second lens 7 is separately coupled to the reflector 35 and the optical isolator 2, the second lens 7 can converge the second optical signal b obtained by deflection of the optical isolator 2, and more accurately couple the second optical signal b to the second optical waveguide 34 after the second optical signal is reflected by the reflector 35.

When the second lens 7 is located between the laser 1 and the optical isolator 2, because the second lens 7 is separately coupled to the laser 1 and the optical isolator 2, the second lens 7 can converge the first optical signal an emitted by the laser 1. After being deflected by the optical isolator 2, the converged first optical signal a can be converted into the converged second optical signal b, and the converged second optical signal b can be more accurately coupled to the second optical waveguide 34 after being reflected by the reflector 35.

In other words, regardless of whether the second lens 7 is located between the reflector 35 and the optical isolator 2 or located between the laser 1 and the optical isolator 2, coupling efficiency of an optical signal can be improved.

Figure 12:
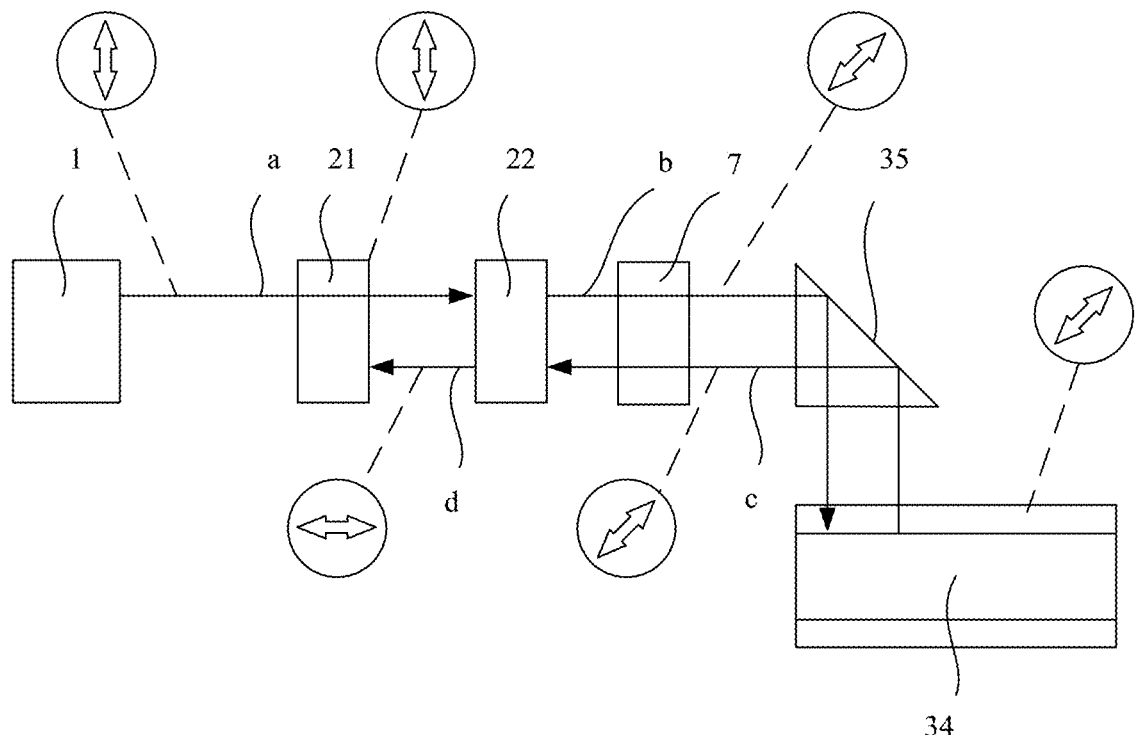
FIG. 12 is a schematic diagram of an optical path of a third structure form of a polarization maintaining device according to an embodiment of this application.

FIG. 12 is a schematic diagram of an optical path of a third structure form of a polarization maintaining device 3. With reference to FIG. 12, the optical path of the third structure form of the polarization maintaining device 3 is described.

In an optical signal emission process, after the laser 1 emits the first optical signal a, the first optical signal a is transmitted to the polarizer 21. Because the polarization direction of the polarizer 21 is the same as the polarization direction of the first optical signal a, the first optical signal a can pass through the polarizer 21 in a lossless manner. After the first optical signal a passes through the polarizer 21, the first optical signal a is transmitted to the optical rotator 22. The first optical signal a is deflected into the second optical signal b under the action of the optical rotator 22, and is further transmitted to the second lens 7. After being transmitted to the second lens 7, the second optical signal b is converged under an action of the second lens 7, to be accurately reflected by the reflector 35 and coupled to the second optical waveguide 34, to be received by the second optical waveguide 34. Therefore, the entire optical signal emission process of the light-emitting assembly is completed.

In an optical signal reflection process, the third optical signal c is reflected by the second optical waveguide 34, and is transmitted to the optical rotator 22 through the second lens 7. The third optical signal c is deflected into the fourth optical signal d under the action of the optical rotator 22, and the fourth optical signal d is transmitted to the polarizer 21, and is absorbed by the polarizer 21.

Figure 13:
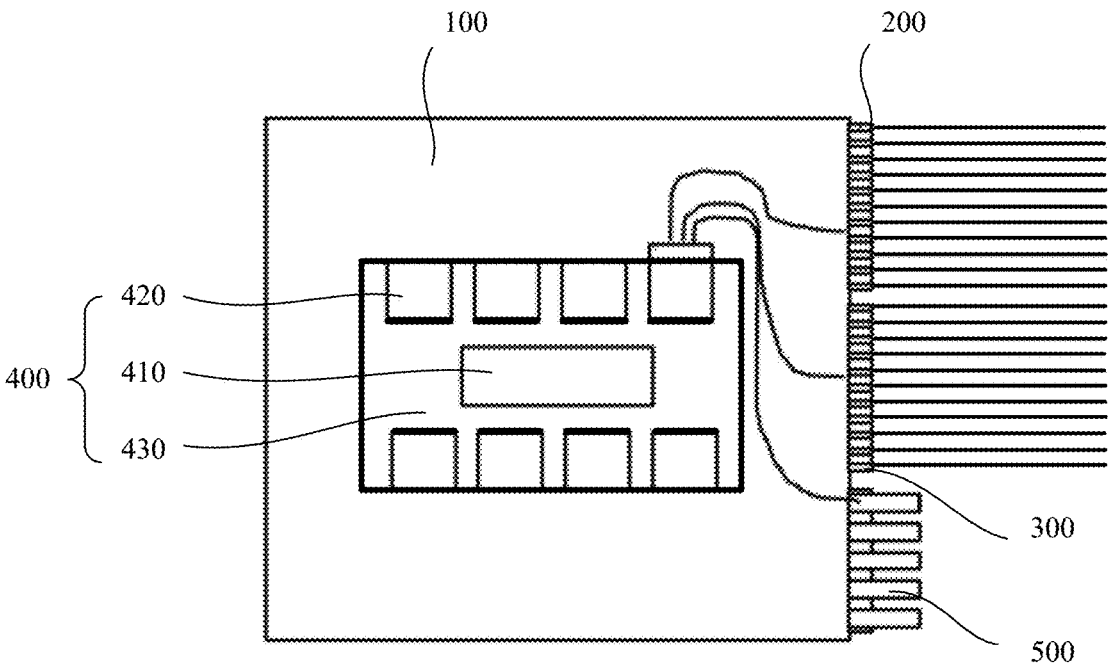
FIG. 13 is a schematic diagram of a structure of an optical communication apparatus according to an embodiment of this application.

FIG. 13 is a schematic diagram of a structure of an optical communication apparatus according to an embodiment of this application. With reference to FIG. 13, the optical communication apparatus includes a board 100, a receive port 200, a transmit port 300, an onboard optical component 400, and a light-emitting assembly 500. The receive port 200, the transmit port 300, the onboard optical component 400, and the light-emitting assembly 500 are all connected to the board 100, and the receive port 200, the transmit port 300, and the light-emitting assembly 500 are separately coupled to the onboard optical component 400.

The receive port 200, the transmit port 300, the onboard optical component 400, and the light-emitting assembly 500 are all integrated on the board 100. In an optical signal emission process, the light-emitting assembly 500 sends an unmodulated optical signal, the optical signal is coupled to the onboard optical component 400, and the optical signal modulated by the onboard optical component 400 is coupled to the transmit port 300, to complete the optical signal emission process. In an optical signal receiving process, the receive port 200 receives an optical signal, couples the optical signal to the onboard optical component 400. After optical detection and photoelectric conversion in the onboard optical component 400, the optical signal receiving process is completed.

In the entire optical signal emission process of the optical communication apparatus, because the light-emitting assembly 500 is the light-emitting assembly 500 according to the first aspect, the light-emitting assembly 500 cannot only output an optical signal having a low loss, but also resist interference of an optical signal reflected in a channel.

In an implementation of this embodiment, the onboard optical component 400 includes an electrical switching chip 410, a silicon optical chip 420, and a carrier 430. The electrical switching chip 410 and the silicon optical chip 420 are connected to the carrier 430 in a bonding or welding manner, and the carrier 430 is connected to the board 100 in a welding manner.

In an implementation of this embodiment, the light-emitting assembly 500 has a polarization maintaining device 3 in the first structure form described above. In this case, the light-emitting assembly 500 is equivalent to a light source pool in the optical communication apparatus. The light-emitting assembly 500 is coupled to the onboard optical component 400 by using polarization maintaining optical fibers 32.

Figure 14:
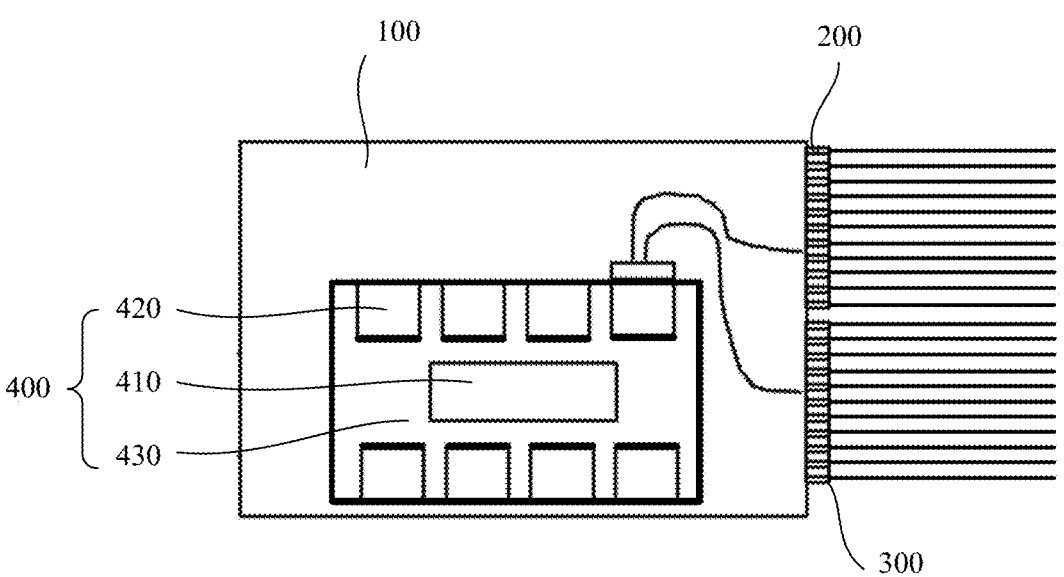
FIG. 14 is a schematic diagram of a structure of an optical communication apparatus according to an embodiment of this application.
Figure 15:
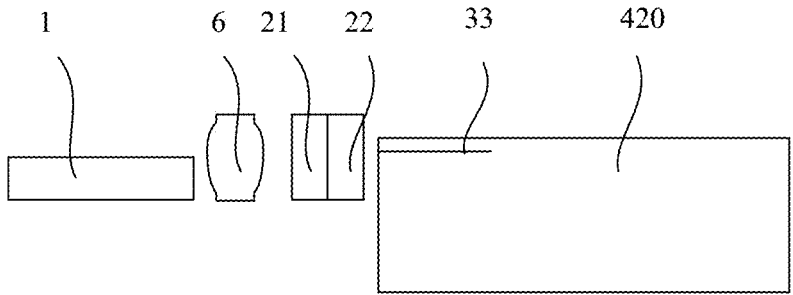
FIG. 15 is a schematic diagram of a layout of a polarization maintaining device according to an embodiment of this application.
Figure 16:
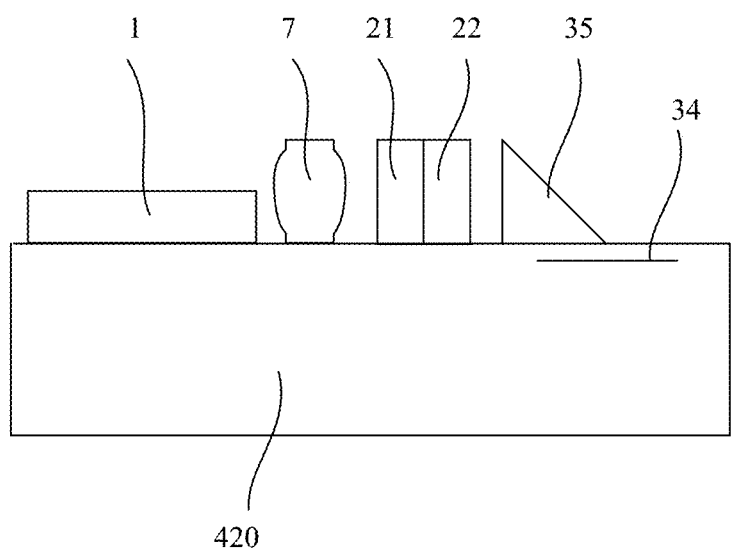
FIG. 16 is a schematic diagram of a layout of a polarization maintaining device according to an embodiment of this application.

In an implementation of this embodiment, refer to FIG. 14, the light-emitting assembly 500 has a polarization maintaining device 3 in the second structure form and the third structure form described above. In this case, the light-emitting assembly 500 and the onboard optical component 400 are integrated together, so that the light-emitting assembly 500 is not shown in the figure, and the first optical waveguide 33 and the second optical waveguide 34 are located in the silicon optical chip 420. The light-emitting assembly 500 is coupled to the onboard optical component 400 in manners of edge light emitting (corresponding to the polarization maintaining device 3 in the second structure form described above, refer to FIG. 15) and vertical light emitting (corresponding to the polarization maintaining device 3 in the third structure form described above, refer to FIG. 16).

In the foregoing specific implementations, the objectives, technical solutions, and beneficial effects of this application are further described in detail. It should be understood that the foregoing descriptions are merely specific implementations of this application, but are not intended to limit the protection scope of this application. Any modification, equivalent replacement, or improvement made based on the technical solutions of this application shall fall within the protection scope of this application.

What is claimed is:

1. A light-emitting assembly, comprising:
    a laser configured to emit a first optical signal;
    a polarization maintaining device configured to receive a second optical signal; and an optical isolator comprising a polarizer and an optical rotator, wherein the laser, the polarizer, the optical rotator, and the polarization maintaining device are sequentially arranged, a polarization direction of the polarizer is the same as a polarization direction of the first optical signal, and the optical rotator is configured to deflect the first optical signal into the second optical signal.

2. The light-emitting assembly according to claim 1, wherein no polarization analyzer exists between the optical rotator and the polarization maintaining device.

3. The light-emitting assembly according to claim 1, wherein an included angle between the polarization direction of the first optical signal and a polarization direction of the second optical signal ranges from 40 degrees to 50 degrees.

4. The light-emitting assembly according to claim 1, wherein:
    the polarizer is attached to the optical rotator;
    one side of the polarizer that is away from the optical rotator faces the laser, and is configured to be optically coupled to the laser; and
    one side that is of the optical rotator and that is away from the polarizer faces the polarization maintaining device, and is configured to be optically coupled to the polarization maintaining device.

5. The light-emitting assembly according to claim 1, wherein:
    a third optical signal reflected by the polarization maintaining device is configured to be coupled to the optical rotator; and
    the optical rotator is configured to deflect the third optical signal into a fourth optical signal, wherein a polarization direction of the fourth optical signal is configured to be perpendicular to the polarization direction of the polarizer.

6. The light-emitting assembly according to claim 1, wherein the polarization maintaining device comprises:
    a substrate having a plurality of grooves on one side, wherein the plurality of grooves are sequentially arranged at intervals; and
    a plurality of polarization maintaining optical fibers, wherein the polarization maintaining optical fibers are inserted into corresponding grooves in a one-to-one correspondence, and one end of each polarization maintaining optical fiber is coupled to the optical isolator.

7. The light-emitting assembly according to claim 6, wherein the laser comprises:
    a base; and
    a plurality of light-emitting units sequentially arranged at intervals and connected to the base, wherein the light-emitting units are in a one-to-one correspondence with the polarization maintaining optical fibers, and the light-emitting units are arranged opposite to corresponding polarization maintaining optical fibers.

8. The light-emitting assembly according to claim 7, further comprising:
    a first lens array located between the laser and the optical isolator, wherein lens units of the first lens array are in a one-to-one correspondence with the light-emitting units, and each lens unit of the first lens array is separately coupled to the optical isolator and a corresponding light-emitting unit.

9. The light-emitting assembly according to claim 7, further comprising:

a second lens array located between the polarization maintaining device and the optical isolator, wherein lens units of the second lens array are in a one-to-one correspondence with the polarization maintaining optical fibers, and each lens unit of the second lens array is separately coupled to the optical isolator and a corresponding polarization maintaining optical fiber.

10. The light-emitting assembly according to claim 1, wherein the polarization maintaining device comprises:

a first optical waveguide extending along a light output direction of the optical isolator, wherein an end of the first optical waveguide is coupled to the optical isolator.

11. The light-emitting assembly according to claim 10, further comprising:

a first lens, wherein the first lens is located between the first optical waveguide and the optical isolator, and the first lens is separately coupled to the first optical waveguide and the optical isolator; or the first lens is located between the laser and the optical isolator, and the first lens is separately coupled to the laser and the optical isolator.

12. The light-emitting assembly according to claim 1, wherein the polarization maintaining device comprises:

a second optical waveguide, wherein an included angle exists between the second optical waveguide and a light output direction of the optical isolator; and a reflector located in the light output direction of the optical isolator, to couple the optical isolator to the second optical waveguide.

13. The light-emitting assembly according to claim 12, further comprising:

a second lens, wherein the second lens is located between the reflector and the optical isolator, and the second lens is separately coupled to the reflector and the optical isolator; or the second lens is located between the laser and the optical isolator, and the second lens is separately coupled to the laser and the optical isolator.

14. An optical communication apparatus, comprising:

a board;

a receive port;

a transmit port;

an onboard optical component; and a light-emitting assembly comprising:

a laser configured to emit a first optical signal, a polarization maintaining device configured to receive a second optical signal, and an optical isolator comprising a polarizer and an optical rotator, wherein the laser, the polarizer, the optical rotator, and the polarization maintaining device are sequentially arranged, a polarization direction of the polarizer is the same as a polarization direction of the first optical signal, and the optical rotator is configured to deflect the first optical signal into the second optical signal, wherein the receive port, the transmit port, the onboard optical component, and the light-emitting assembly are all connected to the board, and the receive port, the transmit port, and the light-emitting assembly are separately coupled to the onboard optical component.

15. The optical communication apparatus according to claim 14, wherein:

a third optical signal reflected by the polarization maintaining device is configured to be coupled to the optical rotator; and the optical rotator is configured to deflect the third optical signal into a fourth optical signal, wherein a polarization direction of the fourth optical signal is configured to be perpendicular to the polarization direction of the polarizer.

16. The optical communication apparatus according to claim 14, wherein the polarization maintaining device comprises:

a substrate having a plurality of grooves on one side, wherein the plurality of grooves are sequentially arranged at intervals; and a plurality of polarization maintaining optical fibers, wherein the polarization maintaining optical fibers are inserted into corresponding grooves in a one-to-one correspondence, and one end of each polarization maintaining optical fiber is coupled to the optical isolator.

17. A method for operating a light-emitting assembly, the light-emitting assembly comprising a laser, an optical isolator, and a polarization maintaining device, the method comprising:

emitting, by the laser, a first optical signal;

receiving, by the polarization maintaining device, a second optical signal; and deflecting, by an optical rotator of the optical isolator, the first optical signal into the second optical signal, wherein the optical isolator comprises a polarizer and the optical rotator, the laser, the polarizer, the optical rotator, and the polarization maintaining device are sequentially arranged, and a polarization direction of the polarizer is the same as a polarization direction of the first optical signal.

18. The method according to claim 17, further comprising:

coupling a third optical signal reflected by the polarization maintaining device to the optical rotator; and deflecting, by the optical rotator, the third optical signal into a fourth optical signal, wherein a polarization direction of the fourth optical signal is perpendicular to the polarization direction of the polarizer.

* * * * *